United States Patent [19]

Koishi et al.

[11] Patent Number: 4,958,124
[45] Date of Patent: Sep. 18, 1990

[54] MULTI-CHANNEL VOLTAGE DETECTOR

[75] Inventors: Musubu Koishi; Shinichiro Aoshima; Yutaka Tsuchiya, all of Shizuoka, Japan

[73] Assignee: Hamamatsu Photonics Kabushiki Kaisha, Shizuoka, Japan

[21] Appl. No.: 245,253

[22] Filed: Sep. 16, 1988

[30] Foreign Application Priority Data

Sep. 18, 1987 [JP] Japan .................................. 62-235367

[51] Int. Cl.$^5$ ..................... G01R 29/12; G01R 31/00; G01B 9/02
[52] U.S. Cl. ................. 324/96; 324/158 R; 350/356; 350/376
[58] Field of Search ..................... 324/96, 158 R, 501; 350/356, 374, 376

[56] References Cited

U.S. PATENT DOCUMENTS

| | | | |
|---|---|---|---|
| 2,936,380 | 5/1960 | Anderson | 250/225 |
| 3,679,974 | 7/1972 | Mollenbeck | 324/96 |
| 4,355,278 | 10/1982 | Burns et al. | 324/501 |
| 4,446,425 | 5/1984 | Valdmanis et al. | 324/77 K |
| 4,463,253 | 7/1984 | Lucht et al. | 250/213 VT |
| 4,578,639 | 3/1986 | Miller | 324/96 |
| 4,645,918 | 2/1987 | Tsuchiya et al. | 250/213 VT |

FOREIGN PATENT DOCUMENTS

| | | |
|---|---|---|
| 0160209 | 6/1985 | European Pat. Off. . |
| 2116732 | 7/1972 | France . |

OTHER PUBLICATIONS

Valdmanis, J. A. et al., "Subpicosecond Electrooptic Sampling: Principles and Applications", IEEE Journal of Quantum Electronics, vol. qe-22, No. 1, pp. 69-78, Jan. 1986.

Valdmanis, J. A. et al., "Picosecond Electrooptic Sampling System", Appl. Phys. Lett., vol. 41, No. 3, pp. 211-212, Aug. 1982.

J. Chang et al., "Photonic Methods of High-Speed Analog Data Recording", The Review of Scientific Instruments, vol. 56, No. 10, Oct. 1985.

E. C. Cassidy, "Pulsed Laser Kerr System Polarimeter for Electro-Optical Fringe Pattern Measurement of Transient Electrical Parameters", The Review of Scientific Instruments, vol. 43, No. 6, Jun. 1972.

G. Paul et al., Elektrie, vol. 22, No. 7, Jul. 1968 (Non--Translated).

*Primary Examiner*—Ernest F. Karlsen
*Attorney, Agent, or Firm*—Finnegan, Henderson, Farabow, Garrett, and Dunner

[57] ABSTRACT

A multi-channel voltage detector for converting multi-channel electrical signals into optical signals and simultaneously detecting multi-channel voltages in parallel mode. Comprising electro-optic conversion means provided thereon with a plurality of electrical circuits for receiving corresponding multi-channel electrical signals to change the refractive index at each of the locations thereon according to the supplied multi-channel electrical signals, means for supplying light having a predetermined polarization to each of the locations, each of the emergent light beams transmitted through the conversion means having a polarization different from said predetermined polarization in accordance with the change in the refractive index of the corresponding location, and photodetecting means for converting the changes in polarization of the emergent light beams to the changes in optical intensity thereof and for simultaneously detecting the changes in optical intensity of the emergent light beams in parallel to thereby simultaneously detect the multi-channel electrical signals in parallel.

15 Claims, 2 Drawing Sheets

MULTI-CHANNEL VOLTAGE DETECTOR

FIELD OF THE INVENTION

The present invention relates to a multi-channel voltage detector for detecting multi-channel voltages in a parallel mode by converting multi-channel electrical signals into optical signals.

BACKGROUND OF THE INVENTION

A multi-channel voltage detector as shown in FIG. 5 has been proposed in the art. The apparatus includes terminals 51-1 through 51-n to which multi-channel electrical signals are applied, a plurality of converters for converting the multi-channel electrical signals into the corresponding optical signals, and a streak camera 55 to which output optical signals of converters 52-1 through 52-n are applied through optical fibers 54-1 through 54-n, respectively.

In this apparatus, electrical signals applied to the terminals 51-1 through 51-n modulate laser diodes 53-1 through 53-n, respectively, in the respective converters 52-1 through 52-n. The variations in intensity of the optical signals outputted by the laser diodes 53-1 and 53-n are simultaneously observed with one streak camera 55 to detect the multi-channel electrical signals in a parallel mode.

In the above-described multi-channel voltage detector, the modulation-permitted frequency of the laser diodes 53-1 through 53-n in the converters 52-1 through 52-n is of the order of a maximum of 1 GHz, and the time resolution is of the order of 350 picoseconds. Therefore, the apparatus suffers from a difficulty that it cannot detect higher frequency electrical signals with high time resolution.

SUMMARY OF THE INVENTION

An object of the present invention is a multi-channel voltage detector that can detect very high frequency electrical signals with a high time resolution.

Another object of the present invention is a multi-channel voltage detector for simultaneously detecting a plurality of high frequency electrical signals with high resolution in parallel.

These and other objects are accomplished by a multi-channel voltage detector for detecting multi-channel electrical signals comprising electro-optic conversion means provided thereon with a plurality of electrical circuits for receiving corresponding multi-channel electrical signals and supplying voltage to corresponding locations on the electro-optic conversion means to change the refractive index at each of the locations according to the supplied voltages, light supplying means for supplying at least one light beam having a predetermined polarization to each of the locations, the light beam being transmitted through the conversion means at each of the locations to provide emergent light beams corresponding to each of the locations and each of the emergent light beams having a polarization different from the predetermined polarization in accordance with the change in the refractive index of the corresponding location, and photodetecting means for converting the changes in polarization of the emergent light beams to the changes in optical intensity thereof and for simultaneously detecting the changes in optical intensity of the emergent light beams in parallel, thereby simultaneously detecting the multi-channel electrical signals in parallel.

BRIEF DESCRIPTION OF THE DRAWINGS

The manner by which the above and other objects are attained will be apparent from the following detailed description when considered in view of the drawings, wherein.

DETAILED DESCRIPTION OF THE INVENTION

The difficulty of limited time resolution associated with a conventional multi-channel voltage detector has been eliminated by the present invention by the provision of a multi-channel voltage detector in which multi-channel electrical signals are converted into optical signals and are simultaneously detected in a parallel mode. Polarized light beams are applied to an electro-optic crystal, and are changed in polarization by the voltages of multi-channel electrical signals applied to a plurality of electrical circuits formed on the electro-optic crystal. The respective polarizations of the light beams are varied in accordance with the corresponding electrical signals through the electro-optic crystal and the changes in polarization of the light beams are extracted. The emergent light beams from the electro-optic crystal are applied in a parallel mode to a photodetector.

In the multi-channel voltage detector of the present invention, multi-channel electrical signals are applied to the electrical circuits formed on the electro-optic crystal to produce electric fields in the electro-optic crystal to provide various refractive indices for locations on the crystal. Under this condition, when polarized light beams are applied to the electro-optic crystal, the light beams are changed in polarization according to the variations in refractive index of the electro-optic crystal which correspond to the variations in voltage of the electrical signals. The changes in polarization are extracted as the changes in optical intensity and applied, in a parallel mode, to the photodetector so that the voltages of the electrical signals can be detected.

Figure 1:
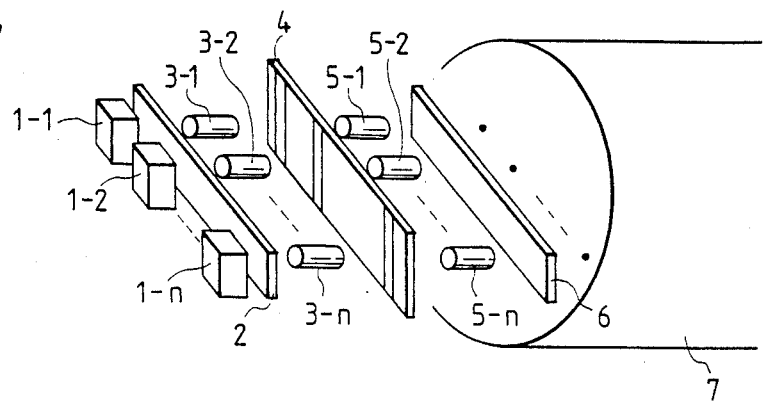
FIG. 1 is an explanatory diagram showing the arrangement of a first example of a multi-channel voltage detector according to the present invention.
Figure 2A:
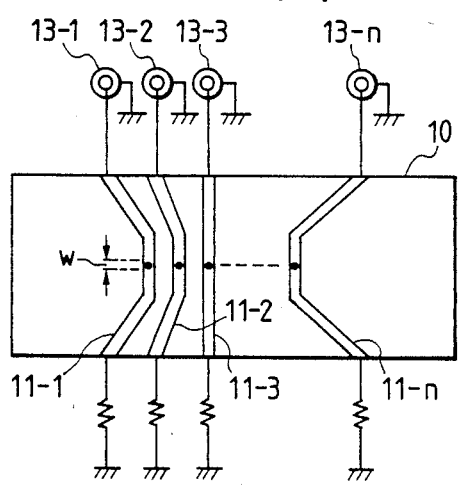
FIGS. 2(a) and 2(b) are a front view and a sectional view of a conversion unit shown in FIG. 1, respectively.
Figure 2B:
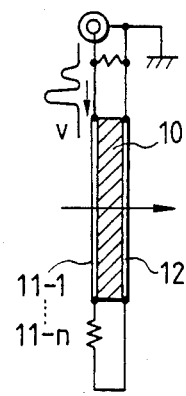

FIG. 1 is an explanatory diagram showing the arrangement of a first example of a multi-channel voltage detector according to the present invention. FIGS. 2(a) and 2(b) are a front view and a sectional view of a conversion section shown in FIG. 1.

The apparatus, as shown in FIG. 1, includes means for supplying light having a predetermined polarization to a plurality of locations on an electro-optic crystal, the light being transmitted through the crystal at each of the locations to provide emergent light beams corresponding to each of the locations. As embodied herein, the light supplying means comprises light sources 1-1 through 1-n the number of which is equal to the number of multi-channel electrical signals to be measured, a polarizer 2 that extracts a predetermined polarization component from the output light beams of the light sources 1-1 through 1-n, and lenses 3-1 through 3-n that condense the light beams passing through the polarizer 2 and focuses them on an electro-optic conversion means having a plurality of electrical circuits formed thereon for supplying voltage to corresponding locations on the conversion means to change the refractive index at each of the locations according to the voltages supplied to the locations. As embodied herein, the conversion means comprises a conversion unit 4, such as an electro-optic crystal.

The apparatus further comprises photodetecting means for converting the changes in polarization of the emergent light beams from the conversion means to the changes in optical intesity thereof and for simultaneously detecting the changes in optical intensity of the emergent light beams in parallel, thereby detecting the amplitude of the voltage applied to the corresponding location of the electro-optic conversion means. As embodied herein, the photodetecting means comprises lenses 5-1 through 5-n that condense the emergent light beams from the conversion unit 4 onto an analyzer 6 that extracts the light beams emerging from the lenses 5-1 through 5-n having a specific polarization component. A photodetector 7, such as a streak camera, receives and detects the light beams that pass through the analyzer 6.

The light sources 1-1 through 1-n are CW(Continuous Wave) light sources, such as gas lasers, for example a He-Ne laser, or solid state lasers, for example semiconductor lasers, light emitting diodes, or YAG lasers.

The conversion unit 4 may comprise an electro-optic crystal 10 (FIGS. 2(a) and 2(b) on which a plurality of electrical circuits (generally referred to as "micro-strip lines") are formed. One example of the electrical circuits is shown in detail in FIGS. 2(a) and 2(b). A plurality of transparent front surface electrodes 11-1 through 11-n are formed at corresponding locations on one surface of the electro-optic crystal 10 while a transparent rear surface electrode 12 is formed on the opposite surface of the crystal 10 so that multi-channel electrical signals from terminals 13-1 through 13-n form electric fields between the front surface electrodes 11-1 through 11-n and the rear surface electrode 12.

The lenses 3-1 through 3-n are, for instance, SEL-FOC lenses or micro-lenses that apply the output light beams of the light sources 1-1 through 1-n, as light spots, to the locations on the front surface of the crystal 10 where the electrodes 11-1 through 11-n are formed.

In the multi-channel voltage detector, the multi-channel electrical signals applied through the terminals 13-1 through 13-n to the front surface electrodes 11-1 through 11-n of the conversion unit 4 propagate on the electrodes 11-1 through 11-n at a constant speed V. As a result, electric fields corresponding to the voltages of the electrical signals are formed between the front surface electrodes 11-1 through 11-n and the rear surface electrode 12 to change the refractive index of the corresponding locations of the electro-optic crystal 10. Under this condition, light beams having the predetermined polarization component and being applied as light spots perpendicularly to the respective front surface electrodes 11-1 through 11-n advance inside the electro-optic crystal 10 in a direction perpendicular to the direction of propagation of the electric fields. The light beams are changed in polarization because the refractive index of the electro-optic crystal 10, as was described above, changes with the electric fields and affects the emergent light beams applied to the analyzer 6 through the respective lenses 5-1 through 5-n. When the emergent light beams having various polarization components pass through the analyzer, only the light beams having a specific polarization component are passed therethrough, so that the optical intensities of the emergent light beams after passing through the analyzer are varied in accordance with the changes in polarization thereof from those of the emergent light beams before passing through the analyzer. That is, the analyzer 6 converts the changes in polarization of the emergent light beams to the changes in optical intensity thereof. The emergent beams, after passing through the analyzer, are applied to the photodetector 7.

The photodetector 7 detects the changes in optical intensity of the emergent light beams to thereby detect the changes in voltage of the electrical signals. In the case where a streak camera is used as the photodetector 7, the emergent light beams passed through the analyzer are swept with time so that waveforms of the multi-channel electrical signals can be observed as the changes in optical intensity in a parallel mode on a phosphor screen.

In the above-described embodiment, the width w of the light spots applied to the electro-optic crystal 10 limits the time resolution, and therefore the width w should not be more than a value corresponding to the time resolution required. For instance, for the time resolution of 2 psec (picoseconds), the width w should be 0.4 mm or less when the propagation speed of the electrical signals is about 5 psec/mm.

As described above, at the time that the electrical signals to be measured are propagated along the front surface electrodes 11-1 through 11-n on the electro-optic crystal 10, the light beams are applied in the form of light spots of small width to the front surface electrodes in the direction perpendicular to the electrical signal propagation direction, so that the changes in polarization of the light beams can be detected. Therefore, even if the voltages of the electrical signals change at a high frequency, they can be detected with high time resolution. The time resolution is limited by the resolution of the photodetector 7; however, when a streak camera having a high-response characteristic is employed as the photodetector 7, a time resolution of 0.3 to 2.0 psec (picoseconds) can be obtained.

Figure 3:
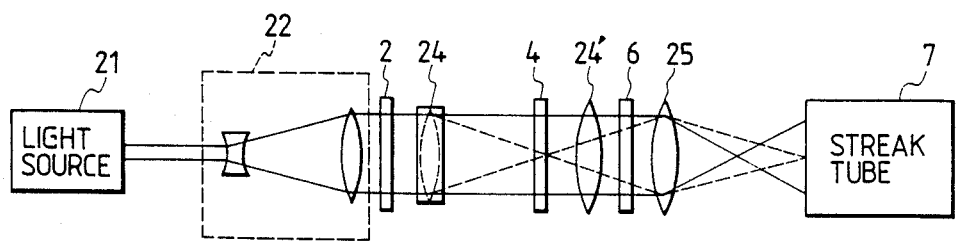
FIG. 3 is an explanatory diagram showing the arrangement of a second example of the multi-channel voltage detector according to the present invention.

FIG. 3 is an explanatory diagram showing a second embodiment of the multi-channel voltage detector according to the present invention. The apparatus, as shown in FIG. 3, comprises a light source 21, a beam expander 22 for converting the output light beam of the light source 21 into parallel rays and a cylindrical lens 24 for condensing only those rays having a predetermined polarization component which are extracted out of the parallel rays by the polarizer 2 and focused in the form of a slit on the respective front surface electrodes 11-1 through 11-n of the conversion unit 4. A lens 24' applies the emergent rays from the conversion unit 4, as parallel rays, to the analyzer 6, which is adapted to extract rays having a specific polarization component. A lens 25 applies the extracted rays to the photodetector 7.

In the multi-channel voltage detector thus organized, the rays having the predetermined polarization component are applied, in the form of a slit, to the conversion unit 4, As in the example described above, the variations in voltage of the electrical signals propagating along the front surface electrodes 11-1 through 11-n of the conversion unit 4 may be detected with the photodetector 7, similarly as in the first embodiment. The second embodiment employs only one light source 21, and is accordingly free of difficulties caused by the use of a plurality of light sources, such as fluctuation in characteristic between the light sources, and it is also simpler in construction than the first embodiment. In the second embodiment, the width of the slit beam on the conversion unit 4 determines the time resolution. Furthermore, in the second example, a prism or a polarizer as used in a camera may be employed as the analyzer 6. When a prism is employed as the analyzer 6, the extinction ratio can be increased; however, in order to extract the rays having the specific polarization component with high accuracy, it is necessary to apply parallel rays to the prism. Thus, the provision of the lens 24' is essential when a prism is employed as the analyzer 6 to obtain high extinction ratio.

In the above-described first and second embodiments of the multi-channel voltage detector, the front surface electrodes 11-1 through 11-n of the conversion unit 4 are in the form of micro-strip lines as shown in FIGS. 2(a) and 2(b). The invention, however, is not limited thereto or thereby. Furthermore, grounding lines may be interposed between the front surface electrodes 11-1 through 11-n in order to reduce crosstalk between the multi-channel electrical signals. Furthermore, in the above-described multi-channel voltage detecting apparatus, only one rear surface electrode 12 is provided for the front surface electrodes 11-1 through 11-n. Separate rear surface electrodes may be provided for respective front surface electrodes.

Figure 4A:
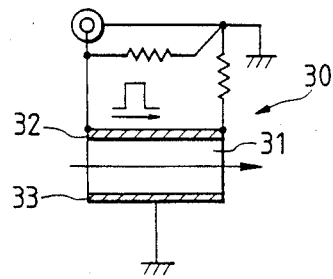
FIGS. 4(a) and (b) explanatory diagrams showing other examples of the conversion unit of FIG. 1.
Figure 4B:
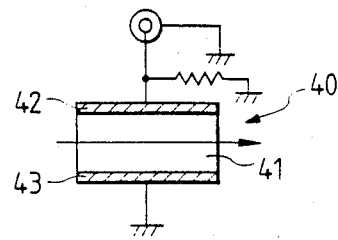
Figure 5:
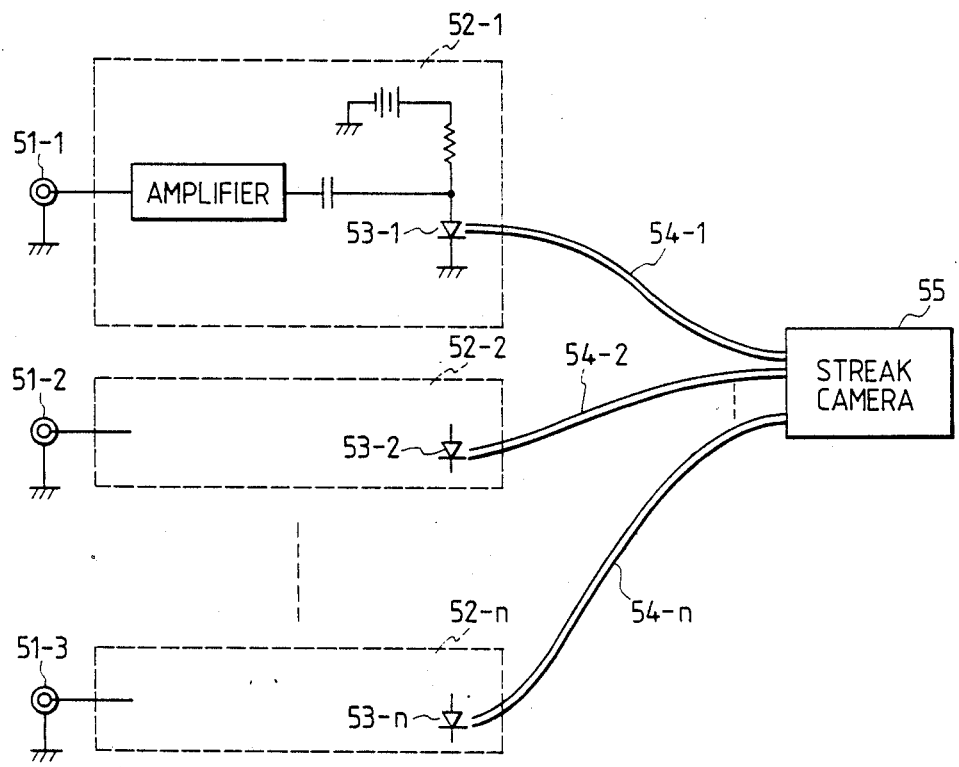
FIG. 5 is an explanatory diagram, partly as a block diagram, showing the arrangement of a conventional multi-channel voltage detector.

Furthermore, instead of the conversion unit 4 as shown in FIGS. 2(a) and 2(b), a conversion unit 30 as shown in FIG. 4(a) or a conversion unit 40 as shown in FIG. 4(b) may be employed.

In the conversion unit 30 of FIG. 4(a), a plurality of front surface electrodes 32 and a rear surface electrode 33 are arranged on an electro-optic crystal 31 in such manner that the electrodes are in parallel with the advancing direction of the light beams so that the electrical signals propagate along the front surface electrodes 32 in the same direction as the light beams. In this case, when the propagation speed of the electrical signals is made equal to that of the light beams in the electro-optic crystal, a spread of the response time due to the propagation time difference can be prevented, as a result, the polarization of the light beams responds quickly to the variations of the electrical signals, and small changes in voltage can be detected with the photodetector 7 with high accuracy.

In the conversion unit 40 of FIG. 4(b), a plurality of front surface electrodes 42 and a rear surface electrode 43 are arranged on an electro-optic crystal 41 in such a manner that the electrodes 42 are in parallel with the direction of propagation of the light beams. The electrical signals, however, do not propagate along the front surface electrodes 42. Therefore, the conversion unit 40 is suitable for the case where high response is not required. The front surface electrodes 32 and 42 and the rear surface electrodes 33 and 43 shown in FIGS. 4(a) and 4(b) may be opaque.

In the above-described first and second examples of the multi-channel voltage detector, the position of the polarizer 2 and the position of the lenses 3-1 through 3-n or the cylindrical lens 24 may be interchanged, and the position of the lenses 5-1 through 5-n or the lens 25 and the position of the analyzer 6 may be interchanged. The incident light beams may be applied through optical fibers to the conversion unit 4. In addition, optical fibers may be provided at the spot positions, or slit position, where the light beams are concentrated by the lenses 5-1 through 5-n, or lens 25, so that the emergent light beams are applied through the optical fibers to the photodetector 7.

In the above-described first and second examples, the light sources 1-1 through 1-n and the light source 21 are CW light sources, and the photodetector 7 is a streak camera. However, when these light sources are pulse light sources, a plurality of photodiodes or photomultiplier tubes may be employed as the photodetector 7.

If the CW light sources are kept turned on with a constant current source, then the following difficulty may be encountered. When a steak camera is employed as the photodetector 7 and is in the sweep standby state, electrons scattered by light beams applied to the photocathode of the steak camera form background noise on the phosphor screen, thus lowering the accuracy of measurement. This difficulty may be eliminated by modulating the CW light sources by a modulator (not shown) so that they emit light beams only for the period of time for which the variations in voltage of the electrical signals are measured. This method can reduce the effect of the background noise produced when the streak camera is in the standby state. Furthermore, if the CW light sources are modulated with electrical signals different from the electrical signals to be measured, then arithmetic operations such as addition and subtraction of these signals can be achieved.

In the case where pulse light sources are used in combination with a plurality of photodiodes or photomultiplier tubes, the voltage waveforms of multi-channel electrical signals having repetitive periods can be observed by a sampling detection technique.

In the above-described examples of the multi-channel voltage detector, each of the conversion unit 4, 30 and 40 has only one electro-optic crystal (10, 31 or 41). However, a plurality of electro-optic crystals may be provided for the multi-channel electrical signals, respectively.

As was described above, in the multi-channel voltage detector of the present invention, the variations in polarization of the light beams due to the variations in voltage of the multi-channel electrical signals are extracted as variations in optical intensity, which are applied, in a parallel mode, to the photodetector. Therefore, many electrical signals with extremely high frequencies can be simultaneously detected with high time resolution.

What is claimed is:

1. A multi-channel voltage detector for detecting multi-channel electrical signals comprising:
   electro-optic conversion means provided thereon with a plurality of electrical circuits for receiving corresponding multi-channel electrical signals and for supplying voltages to corresponding locations on said electro-optic conversion means to change the refractive index at each of said locations according to the supplied voltages;
   light supplying means for supplying at least one light beam having a predetermined polarization to each of said locations, said light beam being transmitted through said electro-optic conversion means at each of said locations to provide emergent light beams corresponding to each of said locations and each of said emergent light beams having a polarization different from said predetermined polarization in accordance with the change in the refractive index of said corresponding location; and photodetecting means for converting the changes in polarization of said emergent light beams to the changes in optical intensity thereof and for simultaneously detecting said changes in optical intensity of said emergent light beams in parallel, thereby simultaneously detecting said multi-channel electrical signals in parallel.

2. A multi-channel voltage detector according to claim 1, wherein said light supplying means comprises;

a plurality of light sources for generating a corresponding plurality of light beams, each of said light beams being associated with a different one of said locations of said electro-optic conversion means;

polarization means for causing each of said light beams to have said predetermined polarization; and first lens means for focusing said polarized light beams on said associated locations of said electro-optic conversion means so that each of said polarized light beams is in a spot form on said electro-optic conversion means.

3. A multi-channel voltage detector according to claim 2, wherein said electro-optic conversion means comprises an electro-optic crystal including a front surface and a rear surface, and wherein said electrical circuits are formed as a first electrode on said front surface of said crystal and a second electrode is formed on said rear surface of said crystal, said first and second electrodes being transparent.

4. A multi-channel voltage detector according to claim 3, wherein said first and second electrodes are formed on said front and rear surfaces of said crystal so that a multi-channel electrical signal propagates on said first electrode in a direction perpendicular to the direction of propagation of said light beam through said crystal.

5. A multi-channel voltage detector according to claim 3, wherein said first electrode comprises microstrip lines.

6. A multi-channel voltage detector according to claim 3, wherein said photodetecting means comprises:

analyzer means for receiving said emergent light beams from said electro-optic crystal and for outputting as light beams each having a corresponding optical intensity proportional to the change in polarization of each emergent light beam from said predetermined polarization;

photodetector for receiving said light beams from said analyzer and detecting the changes in optical intensity of said emergent light beams; and second lens means for focusing said light beams on said analyzer.

7. A multi-channel voltage detector according to claim 6, wherein said photodetector comprises a streak camera.

8. A multi-channel voltage detector according to claim 6, wherein said photodetector comprises a semiconductor device.

9. A multi-channel voltage detector according to claim 6, wherein each of said light sources comprises light source for generating continuous wave light beams.

10. A multi-channel voltage detector according to claim 9, said detector further comprising a modulator for modulating said continuous wave light beams and outputting the modulated light beams to said electro-optic conversion means.

11. A multi-channel voltage detector according to claim 6, wherein said light sources comprise ones for generating pulse light beams so that said emergent light beams are pulse light beams, and said photodetector comprises a plurality of photodiodes, thereby detecting said multi-channel electrical signals by sampling detection technique.

12. A multi-channel voltage detector according to claim 6, wherein said light sources comprises ones for generating pulse light beams so that said emergent light beams are pulse light beams and said photodetector comprises a plurality of photomultiplier tubes, thereby detecting said multi-channel electrical signals by sampling detection technique.

13. A multi-channel voltage detector according to claim 1, wherein said light supplying means comprises:

a light source for generating a light beam;

a beam expander for receiving said light beam and producing a plurality of parallel light beams;

polarization means for receiving said plurality of light beams from said beam expander and for generating a light beam having said predetermined polarization; and first lens means for focusing said polarized beam on said electro-optic conversion means so that said polarized beam is in a slit form on said electro-optic conversion means.

14. A multi-channel voltage detector according to to claim 13, wherein said electro-optic conversion means comprises an electro-optic crystal having a first surface and a second surface, and wherein said electrical circuits are formed as a first electrode on said first surface of said crystal and a second electrode is formed on said second surface of said crystal.

15. A multi-channel voltage detector according to claim 14, wherein said first and second electrodes are provided on said first and second surfaces of said electro-optic crystal so that a multi-channel electrical signal propagates on said first electrode in a direction parallel to the direction of propagation of said light beams from said light supplying means through said electro-optic crystal.

* * * * *